(12) United States Patent
Hashimoto et al.

(10) Patent No.: US 11,410,898 B2
(45) Date of Patent: Aug. 9, 2022

(54) MANUFACTURING METHOD OF MOUNTING STRUCTURE, AND SHEET THEREFOR

(71) Applicant: NAGASE CHEMTEX CORPORATION, Osaka (JP)

(72) Inventors: Takayuki Hashimoto, Tatsuno (JP); Takuya Ishibashi, Tatsuno (JP); Kazuki Nishimura, Tatsuno (JP)

(73) Assignee: NAGASE CHEMTEX CORPORATION, Osaka (JP)

( * ) Notice: Subject to any disclaimer, the term of this patent is extended or adjusted under 35 U.S.C. 154(b) by 0 days.

(21) Appl. No.: 16/760,092

(22) PCT Filed: Oct. 30, 2018

(86) PCT No.: PCT/JP2018/040399
§ 371 (c)(1),
(2) Date: Apr. 29, 2020

(87) PCT Pub. No.: WO2019/088128
PCT Pub. Date: May 9, 2019

(65) Prior Publication Data
US 2020/0357713 A1    Nov. 12, 2020

(30) Foreign Application Priority Data
Oct. 31, 2017   (JP) .............................. JP2017-211050

(51) Int. Cl.
*H01L 23/29* (2006.01)
*H01L 21/56* (2006.01)
*H01L 23/31* (2006.01)

(52) U.S. Cl.
CPC ............ *H01L 23/293* (2013.01); *H01L 21/56* (2013.01); *H01L 23/315* (2013.01);
(Continued)

(58) Field of Classification Search
CPC .... H01L 23/293; H01L 23/295; H01L 23/296
See application file for complete search history.

(56) References Cited

U.S. PATENT DOCUMENTS 7,435,625 B2 * 10/2008 Condie ................. H01L 23/295
                                                              438/124
9,218,989 B2 * 12/2015 Hauhe ................... H01L 23/293
(Continued)

FOREIGN PATENT DOCUMENTS

JP      2015-065368 A    4/2015
JP      2015-076444 A    4/2015
(Continued)

OTHER PUBLICATIONS

International Search Report for PCT/JP2018/040399 dated Dec. 25, 2018 [PCT/ISA/210].
(Continued)

*Primary Examiner* — Brigitte A Paterson
*Assistant Examiner* — Abbigale A Boyle
(74) *Attorney, Agent, or Firm* — Sughrue Mion, PLLC

(57) ABSTRACT

A manufacturing method of a mounting structure, the method including: a step of preparing a mounting member including a first circuit member and a plurality of second circuit members placed on the first circuit member via bumps, the mounting member having a space between the first circuit member and the second circuit member; a step of preparing a sheet having a space maintaining layer; a disposing step of disposing the sheet on the mounting member such that the space maintaining layer faces the second circuit members; and a sealing step of pressing the sheet against the first circuit member and heating the sheet, to seal the second circuit members so as to maintain the space, and to cure the sheet. The bumps are solder bumps. The space maintaining layer after curing has a glass transi-
(Continued)

tion temperature of higher than 125° C., and a coefficient of thermal expansion at 125° C. or lower of 20 ppm/K or less.

8 Claims, 3 Drawing Sheets

(52) U.S. Cl.
CPC ...... *H01L 23/3135* (2013.01); *H01L 23/3142* (2013.01); *H01L 23/291* (2013.01); *H01L 23/295* (2013.01); *H01L 23/296* (2013.01); *H01L 2224/16225* (2013.01)

(56) References Cited

U.S. PATENT DOCUMENTS

| | | | |
|---|---|---|---|
| 2009/0053518 A1* | 2/2009 | Saiki | H01L 23/293 428/352 |
| 2015/0334846 A1 | 11/2015 | Suemori | |
| 2020/0287518 A1* | 9/2020 | Hashimoto | H01L 21/56 |

FOREIGN PATENT DOCUMENTS

| | | | |
|---|---|---|---|
| JP | 2015-179814 A | 10/2015 | |
| JP | 2015179814 A * | 10/2015 | ............ H01L 21/56 |
| JP | 2015-220241 A | 12/2015 | |
| JP | 2017-092103 A | 5/2017 | |
| JP | 2017-108183 A | 6/2017 | |
| JP | 2017-149875 A | 8/2017 | |
| WO | 2013/121689 A1 | 8/2013 | |

OTHER PUBLICATIONS

Extended European Search Report dated Jul. 12, 2021 issued by European Patent Office in corresponding European Application No. 18872696.2.

* cited by examiner

MANUFACTURING METHOD OF MOUNTING STRUCTURE, AND SHEET THEREFOR

CROSS REFERENCE TO RELATED APPLICATIONS

This application is a National Stage of International Application No. PCT/JP2018/040399 filed Oct. 30, 2018, claiming priority based on Japanese Patent Application No. 2017-211050 filed Oct. 31, 2017.

TECHNICAL FIELD

The present invention relates to a manufacturing method of a mounting structure having a space inside, specifically to a manufacturing method of a mounting structure sealed with a sheet, and a sheet therefor.

BACKGROUND ART

Some electronic components (circuit members) placed on a circuit board needs a space (internal space) from the circuit board. One example is a SAW chip used for noise cancellation in cellular phones and other devices. The SAW chip filters a desired frequency by utilizing a surface acoustic wave that propagates on a piezoelectric substrate (piezoelectric body). Therefore, an internal space is necessary between the electrodes on the piezoelectric body and the circuit board on which the SAW chip is placed. The internal space is formed by, for example, placing a circuit member such as SAW chip on a circuit board via bumps, so as to accommodate the functional surface of the circuit member. For sealing a circuit member that needs an internal space as above, a resin sheet is sometimes used (e.g., Patent Literature 1).

CITATION LIST

Patent Literature

[PTL 1] Japanese Laid-Open Patent Publication No. 2015-65368

SUMMARY OF INVENTION

Technical Problem

In manufacturing a mounting structure, a sealing material (cured resin sheet) possibly expands due to heat. The circuit member closely contacting the sealing material is then pulled in the direction in which the sealing material expands. On the other hand, when the sealing material cools down, the circuit member is pulled in the direction in which the sealing material contracts. Since the circuit member itself is hard to deform, the tensile stress applied to the circuit member acts on the bumps disposed in the internal space, so as to peel the bumps off from the circuit board. When the bumps are formed of solder, due to this stress, the bumps are sometimes peeled off from the circuit board. Furthermore, during actual use of the mounting structure, with changes in temperature associated with external environment or self-heating the sealing material often experiences repeated thermal expansion and contraction. In this case also, the solder bumps are repeatedly pulled in the direction in which the sealing material expands and/or contracts, and tend to be damaged.

Solution to Problem

In view of the above, one aspect of the present invention relates to a manufacturing method of a mounting structure, the method including: a step of preparing a mounting member including a first circuit member and a plurality of second circuit members placed on the first circuit member via bumps, the mounting member having a space between the first circuit member and the second circuit member; a step of preparing a sheet having a space maintaining layer; a disposing step of disposing the sheet on the mounting member such that the space maintaining layer faces the second circuit members; and a sealing step of pressing the sheet against the first circuit member and heating the sheet, to seal the second circuit members so as to maintain the space, and to cure the sheet, wherein the bumps are solder bumps, and the space maintaining layer after curing has a glass transition temperature of higher than 125° C., and a coefficient of thermal expansion at 125° C. or lower of 20 ppm/K or less.

Another aspect of the present invention relates to a sheet for sealing a mounting member including a first circuit member and a plurality of second circuit members placed on the first circuit member via solder bumps, the mounting member having a space between the first circuit member and the second circuit member, the sheet including a space maintaining layer, wherein the space maintaining layer after curing has a glass transition temperature of higher than 125° C., and a coefficient of thermal expansion at 125° C. or lower of 20 ppm/K or less.

Advantageous Effects of Invention

According to the present invention, in a mounting structure including a first circuit member and a second circuit member and having a space between the first circuit member and the second circuit member, the connection reliability between the first circuit member and the second circuit member placed thereon can be improved.

DESCRIPTION OF EMBODIMENTS

Figure 1:
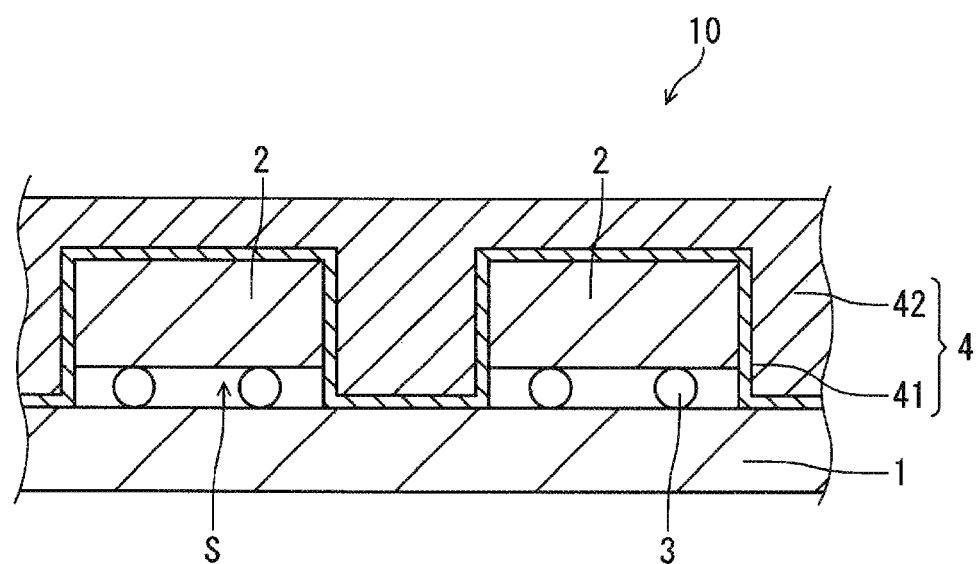
FIG. 1 A schematic cross-sectional view of a mounting structure according to an embodiment of the present invention.

An example of a mounting structure manufactured by a method according to the present embodiment is shown in FIG. 1. FIG. 1 is a schematic cross-sectional view of a mounting structure 10.

The mounting structure 10 includes a first circuit member 1, a plurality of second circuit members 2 placed on the first circuit member 1 via solder bumps 3, and a sealing material 4 sealing the second circuit members 2. A space (internal space S) is formed between the first circuit member 1 and the second circuit member 2. The sealing material 4 is a cured product of the sheet 4P (cf., FIG. 2). The present invention encompasses the sheet 4P.

[Sheet]

Figure 2:
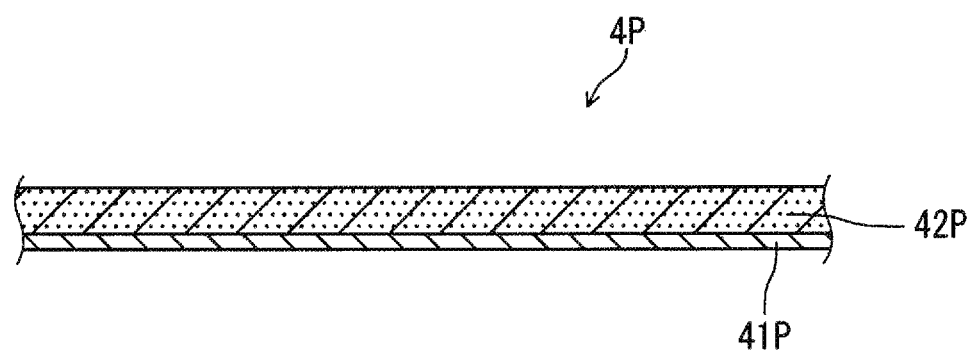
FIG. 2 A schematic cross-sectional view of a sheet according to an embodiment of the present invention.

The sheet 4P is a member for sealing the second circuit members 2 so as to maintain the internal space S. As illustrated in FIG. 2, the sheet 4P has at least a space maintaining layer 41P. FIG. 2 is a schematic cross-sectional view of the sheet 4P.

(Space Maintaining Layer)

The space maintaining layer 41P is disposed so as to face the second circuit members 2 in a disposing step. The layer comes in close contact with the second circuit members 2 and, in a sealing step, serves to maintain the internal space S.

A glass transition temperature of the space maintaining layer after curing (hereinafter, cured space-maintaining layer 41) is higher than 125° C. A coefficient of thermal expansion at 125° C. or lower of the cured space-maintaining layer 41 is 20 ppm/K or less.

The coefficient of thermal expansion can be measured with a thermomechanical analyzer, in accordance with JIS K 7197. The coefficient of thermal expansion can be measured, for example, on a test piece of 2 mm×5 mm×20 mm, using a thermomechanical analyzer (e.g., TMA7100, available from Hitachi High-Tech Science Corporation), in a compression mode, at a temperature rise rate of 2.5° C./min and under a load of 49 mN.

For the mounting structure 10, assuming actual use, it is sometimes required to have durability in a wide temperature range of −55 to 125° C. in a heat cycle test. Even in this case, when the glass transition temperature and the linear expansion coefficient of the cured space-maintaining layer 41 are within the range above, the cured space-maintaining layer 41 shows little deformation and expansion. Therefore, the expansion of the internal space S can be suppressed by the cured space-maintaining layer 41, and the peeling off of the solder bumps 3 from the first circuit member 1 that may occur in association with the expansion of the internal space S can be suppressed.

Furthermore, since the coefficient of thermal expansion at 125° C. or less of the cured space-maintaining layer 41 is 20 ppm/K or less, the expansion of the cured space-maintaining layer 41 in the heat cycle test is almost equal to or smaller than that of the solder bumps 3. As a result, the deformation of the solder bumps 3 can be suppressed, and the damage to the solder bumps 3 can be suppressed. Particularly at −55° C. to 125° C., the coefficient of thermal expansion of the cured space-maintaining layer 41 is preferably 20 ppm/K or less. The above-mentioned coefficient of thermal expansion of the cured space-maintaining layer 41 is an average coefficient of thermal expansion at −55° C. to 125° C.

Moreover, when water is present in the internal space, heat changes water into water vapor, causing the internal space to expand. When the bumps become unable to withstand the expansion of the internal space, cracks occur in the bumps (so-called popcorn phenomenon). The cracks are particularly likely to occur when using solder bumps. According to the present embodiment, however, since the expansion of the internal space S can be suppressed, the occurrence of cracks in the solder bumps 3 as above can be also suppressed.

A loss tangent tan $\delta 1_t$ of the space maintaining layer 41P at a temperature t when the second circuit members are sealed is preferably 1 or less, more preferably 0.9 or less, particularly preferably 0.7 or less. The lower limit of the loss tangent tan $\delta 1_t$ is not limited, but is, for example, 0.1. The space maintaining layer 41P having the loss tangent tan $\delta 1_t$ as above can be used alone to seal the second circuit members 2 so as to maintain the internal space S. Therefore, even when the sheet 4P has another layer whose loss tangent tan $\delta_t$ is large (viscosity is high), the internal space S can be maintained.

The temperature t when the second circuit members 2 are sealed is a temperature of the sheet 4P when the surfaces of the second circuit members 2 are covered with the sheet 4P, with the internal space S maintained. The temperature of the sheet 4P can be replaced with a setting temperature of a heating means for the sheet 4P in the sealing step. When the heating means for the sheet 4P is a press machine, the temperature of the heating means is a setting temperature of the press machine. When the heating means for the sheet 4P is a heater for heating the first circuit member 1, the temperature of the heating means is a setting temperature of the heater for the first circuit member 1. The temperature t can be changed according to, for example, the material of the sheet 4P, but may be, for example, between room temperature +15° C. (40° C.) and 200° C. Specifically, the temperature t is, for example, 50 to 180° C. When the second circuit members 2 are sealed, the sheet 4P may be in an uncured state or in a semi-cured state.

The loss tangent tan $\delta 1_t$ is a ratio: G1"/G1' of a loss shear modulus (G1") to a storage shear modulus (G1') of the space maintaining layer 41P at the temperature t. The storage shear modulus G1' and the loss shear modulus G1" can be measured, for example, on a test piece of 8 mm in diameter×1 mm, using a rheometer (e.g., ARES-LS2, available from TA instruments, Inc.) at a frequency of 1 Hz and a temperature rise rate of 10° C./min. A storage shear modulus G2', and a loss tangent tan $\delta 2$ described later can be measured in a similar manner. Any rheometer complying with JIS K 7244 may be used.

The storage shear modulus G1' at the temperature t is preferably $1.0 \times 10^7$ Pa or less, more preferably $1.0 \times 10^6$ Pa or less. The lower limit of the storage shear modulus G1' is not limited, but may be, for example, $1.0 \times 10^4$ Pa. When the storage shear modulus G1' at the temperature t is within the range as above, the space maintaining layer 41P is unlikely to enter the internal space S in the sealing step and is likely to flow so as to come in close contact with the surfaces of the second circuit members 2 and the surfaces between the second circuit members 2 of the first circuit member 1.

In view of electrical insulation, the volumetric resistivity of the space maintaining layer 41P is preferably $1 \times 10^8$ Ω·cm or more, more preferably $1 \times 10^{10}$ Ω·cm or more.

A thickness T1 of the space maintaining layer 41P is not limited. The thickness T1 may be 120 μm or less, may be 100 μm or less, and may be 80 μm or less. This makes it possible to achieve height reduction. On the other hand, in view of suppressing the expansion of the internal space S, the thickness T1 is preferably 1 μm or more, more preferably 10 μm or more. The thickness T1 of the space maintaining layer 41P is a distance between the principal surfaces of the space maintaining layer 41P. The distance between the principal surfaces can be determined by averaging the distances at 10 randomly selected points.

The space maintaining layer 41P is formed of, for example, a resin composition containing a thermosetting resin and a curing agent (hereinafter, first resin composition).

Examples of the thermosetting resin include, but not limited to, epoxy resin, (meth)acrylic resin, phenol resin, melamine resin, silicone resin, urea resin, urethane resin, vinyl ester resin, unsaturated polyester resin, diallyl phthalate resin, and polyimide resin. These may be used singly or in combination of two or more kinds thereof. Preferred is an epoxy resin.

The thermosetting resin before sealing may be in an uncured state or in a semi-cured state. The semi-cured state means a state in which the thermosetting resin includes a monomer and/or an oligomer, and the development of three-dimensional cross-linked structure of the thermosetting resin is insufficient. The semi-cured thermosetting resin is in a so-called B stage, i.e., a state in which the resin does not dissolve in a solvent at room temperature (25° C.) or contains a non-dissolvable component, but is not cured completely.

Examples of the epoxy resin include, but not limited to, bisphenol A-type epoxy resin, bisphenol F-type epoxy resin, bisphenol AD-type epoxy resin, hydrogenated bisphenol A-type epoxy resin, hydrogenated bisphenol F-type epoxy resin, phenol novolac-type epoxy resin, naphthalene-type epoxy resin, alicyclic aliphatic epoxy resin, and glycidyl ethers of organic carboxylic acids. These may be used singly or in combination of two or more kinds thereof. The epoxy resin may be a prepolymer, and may be a copolymer of an epoxy resin, such as polyether-modified epoxy resin or silicone-modified epoxy resin, and another polymer. Preferred are a bisphenol AD-type epoxy resin, a naphthalene type epoxy resin, a bisphenol A-type epoxy resin, and/or a bisphenol F-type epoxy resin. Particularly preferred are a bisphenol A-type epoxy resin and a bisphenol F-type epoxy resin because of their excellent heat resistance and water resistance and their inexpensive prices.

For viscosity adjustment of the resin composition, the epoxy resin can include a monofunctional epoxy resin having one epoxy group in its molecule, in an amount of approximately 0.1 to 30 mass % or less in the whole epoxy resin. Examples of the monofunctional epoxy resin include phenylglycidyl ether, 2-ethylhexyl glycidyl ether, ethyldiethylene glycol glycidyl ether, dicyclopentadiene glycidyl ether, and 2-hydroxyethyl glycidyl ether. These may be used singly or in combination of two or more kinds thereof.

The resin composition includes a curing agent for the thermosetting resin. Examples of the curing agent include, but not limited to, a phenolic curing agent (e.g., phenol resin), a dicyandiamide-based curing agent (e.g., dicyandiamide), a urea-based curing agent, an organic acid hydrazide-based curing agent, a polyamine salt-based curing agent, an amine adduct-based curing agent, an acid anhydride-based curing agent, and an imidazole-based curing agent. These may be used singly or in combination of two or more kinds thereof. The kind of the curing agent may be selected as appropriate according to the thermosetting resin. Preferred is a phenol-based curing agent because of its low outgassing during curing, moisture resistance, and heat cycle resistance.

The amount of the curing agent differs depending on the kind of the curing agent. When an epoxy resin is used, for example, the curing agent can be used in an amount such that the functional group equivalent of the curing agent is 0.001 to 2 eq, and further 0.005 to 1.5 eq, per one equivalent of the epoxy group.

The dicyandiamide-based curing agent, the urea-based curing agent, the organic acid hydrazide-based curing agent, the polyamine salt-based curing agent, and the amine adduct-based curing agent are latent curing agents. The activation temperature of the latent curing agent is preferably 60° C. or higher, and further 80° C. or higher. The activation temperature is preferably 250° C. or lower, and further 180° C. or lower. This can provide a resin composition that can cure quickly at a temperature equal to or higher than the activation temperature.

The resin composition may contain a third component other than the above. Examples of the third component include a thermoplastic resin, an inorganic filler, a curing accelerator, a polymerization initiator, an ion catcher, a flame retardant, a pigment, a silane coupling agent, and a thixotropic agent.

The thermoplastic resin can be blended as a sheeting agent. The resin composition, by being formed into a sheet, exhibits improved handleability in the sealing process and is unlikely to cause dripping or other inconveniences. This serves to maintain the internal space S.

The thermoplastic resin may be of the following kind: for example, acrylic resin, phenoxy resin, polyolefin, polyurethane, block isocyanate, polyether, polyester, polyimide, polyvinyl alcohol, butyral resin, polyamide, vinyl chloride, cellulose, thermoplastic epoxy resin, and thermoplastic phenol resin. Preferred is an acrylic resin because it functions well as a sheet-forming agent. The amount of the thermoplastic resin is preferably 5 to 200 parts by mass, particularly preferably 10 to 100 parts by mass, per 100 parts by mass of the thermosetting resin.

The thermoplastic resin may be added in any form to the resin composition. The thermoplastic resin may be particles having a weight average particle diameter of, for example, 0.01 to 200 μm, preferably 0.01 to 100 μm. The particles may have a core-shell structure. In this case, the core may be, for example, a polymer containing a unit derived from at least one monomer selected from the group consisting of n-, i-, and t-butyl(meth)acrylates, and may be a polymer containing a unit derived from a (meth)acrylate other than the above. The shell layer may be, for example, a copolymer of a monofunctional monomer, such as methyl(meth)acrylate, n-, i-, or t-butyl(meth)acrylate, or (meth)acrylic acid, and a polyfunctional monomer, such as 1,6-hexanediol diacrylate. Also, for example, a high-purity thermoplastic resin dispersed or dissolved in a solvent may be added to the resin compound.

Examples of the inorganic filler that may be contained in the resin composition include silica such as fused silica, talc, calcium carbonate, titanium white, red iron oxide, silicon carbide, and boron nitride (BN). Preferred is a fused silica because of its inexpensive price. The average particle size of the inorganic filler is, for example, 0.01 to 100 The amount of the inorganic filler is preferably 1 to 5000 parts by mass, more preferably 10 to 3000 parts by mass, per 100 parts by mass of the thermosetting resin. The average particle size means a particle diameter at 50% cumulative volume in a volumetric particle size distribution (D50; this applies hereinafter).

Examples of the curing accelerator include, but not limited to, a modified imidazole-based curing accelerator, a modified aliphatic polyamine-based accelerator, and a modified polyamine-based accelerator. The curing accelerator is preferably used in the form of a reaction product (adduct) with a resin such as an epoxy resin. These may be used singly or in combination of two or more kinds thereof. In view of storage stability, the activation temperature of the curing accelerator is preferably 60° C. or higher, more preferably 80° C. or higher. The activation temperature is preferably 250° C. or lower, more preferably 180° C. or lower. The activation temperature herein refers to a temperature at which the curing of the thermosetting resin is accelerated rapidly by the action of the latent curing agent and/or the curing accelerator.

The amount of the curing accelerator differs depending on the kind of the curing accelerator. Usually, the amount is preferably 0.1 to 20 parts by mass, more preferably 1 to 10 parts by mass, per 100 parts by mass of the epoxy resin. When the curing accelerator is used in the form of an adduct, the amount of the curing accelerator means the net amount of the curing accelerator excluding the component (e.g., epoxy resin) other than the curing accelerator.

The polymerization initiator exhibits curability by irradiation with light and/or application of heat. The polymerization initiator may be, for example, a radical generator, an acid generator, or a base generator. Specific examples thereof include a benzophenone-based compound, a hydroxy ketone-based compound, an azo compound, an organic peroxide, and a sulfonium salt, such as aromatic sulfonium salt or aliphatic sulfonium salt. The amount of the polymerization initiator is preferably 0.1 to 20 parts by mass, more preferably 1 to 10 parts by mass, per 100 parts by mass of the epoxy resin.

(Stress Release Layer)

The sheet 4P preferably further includes a stress release layer 42P The stress release layer after curing (hereinafter, cured stress-release layer 42) serves to reduce the stress (internal stress) applied to the mounting structure 10 during the manufacturing process and other occasions, thereby to suppress warpage and the like of the mounting structure 10. Particularly in the mounting structure 10 which is sealed with the sealing material 4 including the cured space-maintaining layer 41, warpage tends to occur. Moreover, when the first circuit member 1 includes a ceramic substrate, the warpage is difficult to be corrected. It is therefore preferable to provide the cured stress-release layer 42, to reduce the internal stress of the cured space-maintaining layer 41 and the ceramic substrate.

A loss tangent tan δ2 of the cured stress-release layer 42, in a temperature range equal to or lower than its glass transition temperature, is preferably 0.02 or more at 40° C. or higher, and is preferably 0.02 or more even at 35° C. or higher, and preferably 0.02 or more even at 25° C. or higher. In this case, the stress tends to be reduced while the mounting structure is cooled down to room temperature (20 to 30° C.) after manufacturing, and the warpage tends to be eliminated. The loss tangent tan δ2 of the cured stress-release layer 42, in the temperature range equal to or lower than its glass transition temperature, may be 0.05 or more at 40° C. or higher, may be 0.05 or more at 35° C. or higher, and may be 0.05 or more at 25° C. or higher.

The loss tangent tan δ2 of the cured stress-release layer 42 is, in the temperature range equal to or lower than its glass transition temperature, for example, 3 or less, 1.5 or less, or 0.5 or less at 40° C. or higher.

The loss tangent tan δ2 of the cured stress-release layer 42 may be, in the temperature range equal to or lower than its glass transition temperature, larger than the loss tangent tan δ1 of the cured space-maintaining layer 41 at, for example, 25° C. or higher.

On the other hand, the glass transition temperature of the cured stress-release layer 42 is not limited. The glass transition temperature of the cured stress-release layer 42 is preferably 125° C. or lower. In this case, the loss tangent tan δ2 at a temperature of 125° C. or lower tends to increase.

A loss tangent tan $δ2_t$ of the stress release layer 42P at the temperature t is preferably greater than 0.3, and preferably greater than 0.4. The upper limit of the loss tangent tan $δ2_t$ is not limited, but is, for example, 8. The loss tangent tan $δ2_t$ of the stress release layer 42P may be larger than the loss tangent tan $δ1_t$ of the space maintaining layer 41P.

A storage shear modulus G2' of the stress release layer 42P at the temperature t is preferably $1.0 \times 10^3$ Pa or more, more preferably $1.0 \times 10^4$ Pa or more. In this case, after the second circuit members 2 are sealed, the stress (internal stress) in the first circuit member 1 and the second circuit members 2, and further in the cured space-maintaining layer 41 is likely to be reduced. The upper limit of the storage shear modulus G2' is not limited, but is, for example, $1.0 \times 10^7$ Pa, and preferably $1.0 \times 10^6$ Pa.

The stress release layer 42P is formed of a resin composition containing a thermosetting resin and a curing agent (hereinafter, second resin composition). The constitution of the second resin composition is not limited, but may be similar to that of the first resin composition. The second resin composition preferably includes an epoxy resin containing a rubber component (e.g., a rubber-modified epoxy resin) or the like because this increases the creep deformation.

The viscoelasticity (i.e., loss tangent tan δ) can be adjusted, for example, by the raw material of the space maintaining layer 41P and/or the stress release layer 42P. For example, changing the amount or the kind of the thermoplastic resin serving as the sheeting agent can change the loss tangent tan δ. Specifically, using a phenoxy resin can easily lower the storage shear modulus G2' and increase the tan δ 2. The amount of the thermoplastic resin contained in the second resin composition is preferably 5 to 200 parts by mass, more preferably 10 to 100 parts by mass, per 100 parts by mass of the thermosetting resin.

A thickness T2 of the stress release layer 42P is preferably 10 μm or more, more preferably 50 μm or more, in view of stress reduction. In this case, the sealed surface of the mounting structure 10 tends to be smooth, and this can ease the dicing of the mounting structure 10. On the other hand, in view of height reduction, the thickness T2 of the stress release layer 42P is preferably 1400 μm or less, more preferably 420 μm or less. The volumetric resistivity of the stress release layer 42P is not limited, but may be almost equal to or smaller than that of the space maintaining layer 41P.

An overall thickness T of the sheet 4P is not limited. In view of bringing it into close contact with the surfaces of the second circuit members 2, the thickness T is preferably 11 to 1500 μm, more preferably 20 to 1000 μm, particularly preferably 20 to 500 μm.

The sheet 4P may further include a third layer. Note that the space maintaining layer 41P is disposed on one outermost side. The stress release layer 42P may be disposed at any position, but is preferably disposed adjacent to the space maintaining layer 41P. In other words, when the third layer is included, the stress release layer 42P is preferably disposed as an internal layer. The third layer may be a single layer or a laminate of a plurality of layers.

[Manufacturing Method of Mounting Structure]

A manufacturing method according to the present embodiment will be described below with reference to FIG. 3(a) to FIG. 3(d). FIG. 3(a) to FIG. 3(d) are schematic diagrams for explaining a manufacturing method according to the present embodiment by way of cross sections of a mounting member or a mounting structure 10.

The mounting structure 10 is manufactured by a method including: a first preparation step of preparing a mounting member including a first circuit member 1 and a plurality of second circuit members 2 placed on the first circuit member 1 via solder bumps 3, the mounting member having an internal space S between the first circuit member 1 and the second circuit member 2; a second preparation step of preparing a sheet 4P; a disposing step of disposing the sheet 4P on the mounting member such that a space maintaining layer 41P of the sheet 4P faces the second circuit members 2; and a sealing step of pressing the sheet 4P against the first circuit member 1 and heating the sheet 4P, to seal the second circuit members 2 so as to maintain the internal space S, and to cure the sheet 4P. The method may further include an individualization step of dicing the obtained mounting structure 10 into individual second circuit members 2.

(First Preparation Step)

Figure 3A:
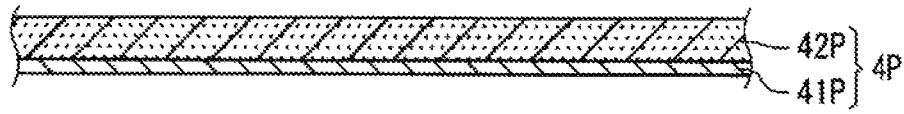
FIG. 3($a$) to FIG. 3($d$) A set of schematic diagrams for explaining a manufacturing method according to an embodiment of the present invention by way of cross sections of a mounting member or the mounting structure.
Figure 3A:
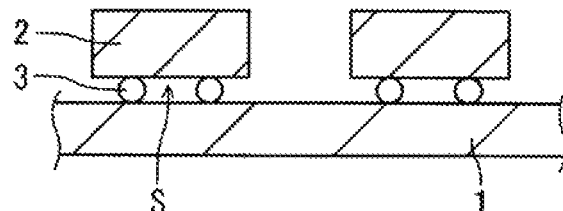

A mounting member including a first circuit member 1 and a plurality of second circuit members 2 placed on the first circuit member 1 via solder bumps 3 is prepared (FIG. 3(a)). The mounting member has an internal space S between the first circuit member 1 and the second circuit member 2.

The first circuit member 1 is, for example, at least one selected from the group consisting of a semiconductor element, a semiconductor package, a glass substrate, a resin substrate, a ceramic substrate, and a silicon substrate. The first circuit member 1 may have at its surface an electrically conductive material layer, such as ACF (anisotropic conductive film) or ACP (anisotropic conductive paste). The resin substrate may be a rigid resin substrate or a flexible resin substrate, examples of which include an epoxy resin substrate (e.g., glass epoxy substrate), a bismaleimide triazine substrate, a polyimide resin substrate, and a fluororesin substrate. The first circuit member 1 may be a component built-in substrate in which a semiconductor chip and the like are incorporated.

The second circuit member 2 is placed on the first circuit member 1 with the solder bumps 3 interposed therebetween. This forms the internal space S between the first circuit member 1 and the second circuit member 2. The second circuit member 2 is an electronic component that requires to be sealed (hollow-sealed) with the internal space S maintained. Examples of the second circuit member 2 include RFIC, SAW, sensor chip (e.g., acceleration sensor), piezoelectric oscillator chip, quartz oscillator chip, and MEMS device.

In short, the mounting member may have various structures in which the second circuit members 2 are placed on various kinds of the first circuit member 1, such as a chip-on-board (CoB) structure (including chip-on-wafer (CoW), chip-on-film (CoF), and chip-on-glass (CoG)), a chip-on-chip (CoC) structure, a chip-on-package (CoP) structure, and a package-on-package (PoP) structure. The mounting member may be a multi-layered mounting member in which, for example, on the first circuit member 1 with the second circuit members 2 placed thereon, the first member and/or the second circuit members 2 are further placed.

The solder bumps 3 have electrical conductivity, and the first circuit member 1 and the second circuit member 2 are electrically connected to each other via the solder bumps 3. The height of the bumps 3 is not limited, but may be, for example, 10 to 150 and may be 40 to 70 μm. The composition of the solder bumps 3 is also not limited. An exemplary composition is a solder mainly composed of lead, or a lead-free solder mainly composed of tin. The solder bump 3 may include, in addition to lead or tin, for example, zinc, antimony, indium, silver, bismuth, copper, aluminum, and the like. Specific examples of the material of the solder bump 3 include lead-tin alloy, tin-silver-copper alloy, tin-zinc-aluminum alloy, and tin-bismuth-silver alloy.

(Second Preparation Step)

A sheet 4P including a space maintaining layer 41P and, if necessary, a stress release layer 42P is prepared (FIG. 3(a)).

When the sheet 4P has a plurality of layers, the production method thereof is not limited. The sheet 4P may be formed by separately forming each layer and laminating the layers together (laminating method), or by sequentially applying a material of each layer (coating method).

In the laminating method, each layer is formed by a process including, for example, a step of preparing a solvent paste or solvent-free paste containing the above resin composition (hereinafter, simply collectively referred to as paste), and a step (forming step) of forming each layer from the paste. The space maintaining layer 41P and the stress release layer 42P are each formed through the above process, and then laminated in this order. When the paste contains a pre-gelling agent, gelation is carried out during the Raining step. The gelation is carried out after a paste is formed into a thin film, by heating the thin film at a temperature lower than the curing temperature of the thermosetting resin (e.g., at 70 to 150° C.) for 1 to 10 min.

On the other hand, in the coating method, for example, the space maintaining layer 41P is formed through the above process, which is followed by applying a paste containing the second resin composition onto a surface of the space maintaining layer 41P, to form the stress release layer 42P. In this case also, gelation can be carried out during the forming step. The gelation may be carried out one after another for each paste formed into a thin film, and may be carried out after the thin films are formed into a laminate.

Each layer (thin film) is formed using, for example, a die, a roll coater, or a doctor blade. In this case, the paste is preferably adjusted to have a viscosity of 10 to 10,000 mPa·s. When a solvent paste is used, the film may be dried at 70 to 150° C. for 1 to 10 min, thereby to remove the solvent. The gelation and the removal of the solvent can be carried out simultaneously.

(Disposing Step)

The sheet 4P is disposed onto the mounting member such that the space maintaining layer 41P faces the second circuit members 2 (FIG. 3(a)).

At this time, the plurality of the second circuit members 2 may be covered with one piece of the sheet 4P In this case, the sheet 4P can be disposed, by one operation, so as to face the surfaces of the plurality of the second circuit members 2 and the surfaces between the second circuit members 2 of the first circuit member 1.

(Sealing Step)

Figure 3B:
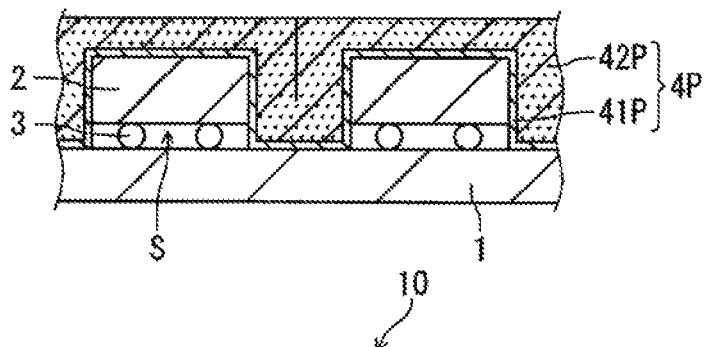
Figure 3C:
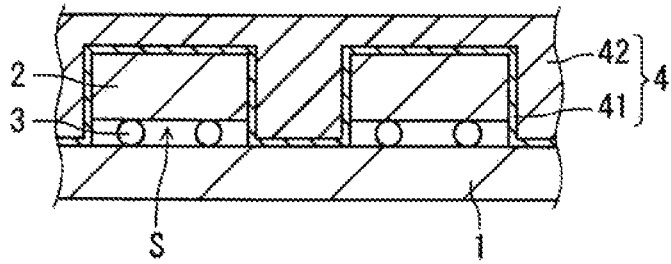

The sheet 4P is pressed against the first circuit member 1 (FIG. 3(b)), and the sheet 4P is heated and cured (FIG. 3(c)). This can seal the second circuit members 2, so as to maintain the internal space S.

The pressing of the sheet 4P against the first circuit member 1 is performed, for example, while heating the sheet 4P at a temperature lower than the curing temperature of the thermosetting resin contained in the sheet 4P (hot pressing). This allows the sheet 4P to come in close contact with the surfaces of the second circuit members 2, as well as to extend until it reaches the surfaces of the first circuit member 1 between the second circuit members 2, which can improve the reliability of sealing of the second circuit members 2. The hot pressing may be performed under atmospheric pressure, and may be performed under a reduced pressure atmosphere (e.g., 50 Pa or more and 50,000 Pa or less, preferably 50 Pa or more and 3,000 Pa or less). The heating conditions during pressing are not limited, but may be set as appropriate according to the pressing method and the kind of the thermosetting resin. The heating is performed, for example, at 40 to 200° C. (preferably 50 to 180° C.) for 1 sec to 300 min (preferably 3 sec to 300 min).

Heating the sheet 4P at the above curing temperature to cure the thermosetting resin forms a sealing material 4. The second circuit members 2 are thus sealed. The conditions for heating the sheet 4P (curing the thermosetting resin) may be set as appropriate according to the kind of the thermosetting resin. The curing of the thermosetting resin is performed, for example, at 50 to 200° C. (preferably 120 to 180° C.) for 1 sec to 300 min (preferably, 60 min to 300 min).

The hot pressing and the curing of the thermosetting resin may be performed separately or simultaneously. For example, after the hot pressing is performed at a temperature lower than the curing temperature of the thermosetting resin contained in the sheet 4P under a reduced pressure atmosphere, the reduced pressure is released, and heating may be performed at a higher temperature under atmospheric pressure, to cure the thermosetting resin. Alternatively, after the hot pressing is performed at a temperature lower than the curing temperature of the thermosetting resin contained in the sheet 4P under atmospheric pressure, heating may be performed at a higher temperature, to cure the thermosetting resin. Alternatively, the hot pressing may be performed at the curing temperature under a reduced pressure atmosphere, so that the thermosetting resin is cured during pressure reduction.

(Individualization Step)

Figure 3D:
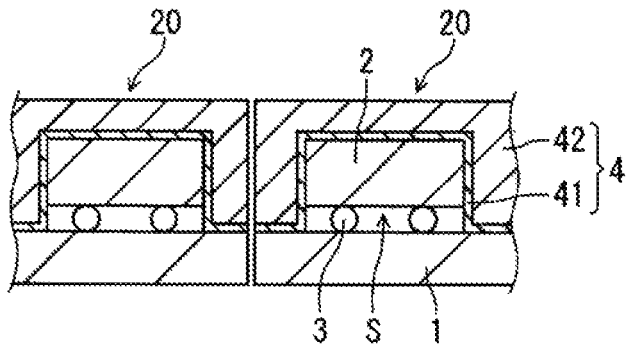

An individualization step of dicing the obtained mounting structure 10, to individualize the second circuit members 2 may be performed (FIG. 3(d)). This provides a chip-level mounting structure (mounting chip 20).

EXAMPLES

The present invention will be more specifically described below, with reference to Examples. It is to be noted, however, that the following Examples do not limit the present invention.

Example 1

(1) Preparation of Resin Composition

Resin compositions A to H each having a composition shown in Table 1 were prepared using the following materials. The unit of the numerical values representing the compositions in the table is part(s) by mass.

<Thermosetting Resin>
 Ep: epoxy resin (epoxy equivalent: 183 g/eq)
<Curing Agent>
 Hd-A: phenol novolac resin A (hydroxyl group equivalent: 173 g/eq)
 Hd-B: phenol novolac resin B (epoxy equivalent: 105 g/eq)
 Hd-C: phenol novolac resin C (epoxy equivalent: 143 g/eq)
<Thermoplastic Resin>
 AcR: acrylic resin
 PhR: phenoxy resin
<Curing Accelerator>
 IMZ: imidazole
<Inorganic Filler>
 s-SiL: fused spherical silica

TABLE 1

| Composition | A | B | C | D | E | F | G | H |
|---|---|---|---|---|---|---|---|---|
| Ep | 100 | 100 | 100 | 100 | 100 | 100 | 100 | 100 |
| Hd-A | 80 | 80 | — | — | — | — | — | — |
| Hd-B | — | — | 60 | 60 | — | 60 | 65 | 60 |

TABLE 1-continued

| Composition | A | B | C | D | E | F | G | H |
|---|---|---|---|---|---|---|---|---|
| Hd-C | — | — | — | — | 75 | — | — | — |
| AcR | 50 | 30 | 10 | 50 | 60 | — | 40 | 20 |
| PhR | — | — | — | — | — | 35 | — | — |
| IMZ | 4 | 4 | 3 | 2 | 4 | 3 | 3 | 3 |
| s-SiL | 325 | 325 | 1000 | 750 | 300 | 500 | 250 | 500 |

[Evaluation 1]

<Storage Shear Modulus and Tan $\delta_t$>

The resin compositions A to H were each applied onto a PET film, and heated at 100° C. for 5 min, to prepare an uncured sheet having a thickness of 1 mm. A test piece of 8 mm in diameter×1 mm sampled from the obtained uncured sheet was used to determine, in accordance with JIS K 7244, a storage shear modulus G' and a loss shear modulus G" at a temperature t when the second circuit members 2 were sealed (80° C. or 100° C.), and a loss tangent tan $\delta_t$ (G"/G') at the temperature t was calculated. The rheometer used here was ARES-LS2 (available from TA instruments, Inc.). The measurement was performed at a frequency of 1 Hz and a temperature rise rate of 10° C./min. The results are shown in Table 2.

<Glass Transition Temperature (Tg)>

The resin compositions A to H were each applied onto a PET film, and heated at 150° C. for 180 min to cure the thermosetting resin, to prepare a cured sheet having a thickness of 1 mm. A test piece of 8 mm in diameter×1 mm sampled from the obtained cured sheet was used to determine storage shear moduli G' and loss shear moduli G" at −55° C. to 125° C. under similar conditions to those in the above evaluation 1. A temperature showing the largest loss tangent tan δ (G"/G') was determined as a glass transition temperature. The results are shown in Table 2.

<tan δ2>

With respect to the cured sheet of a resin composition used as the stress release layer, the smallest value of the loss tangent tan δ2 at 40° C. or higher and in a temperature range equal to Tg or lower was determined. The results are shown in Table 2.

<Coefficient of Thermal Expansion>

The resin compositions A to H were heated at 150° C. for 180 min, to obtain a massive cured product of the thermosetting resin. A test piece of 2 mm×5 mm×20 mm sampled from the massive cured product was used to determine an average coefficient of thermal expansion at −55° C. to 125° C. in accordance with JIS K 7197. The thermomechanical analyzer used here was TMA7100 (available from Hitachi High-Tech Science Corporation). The measurement was performed in a compression mode, at a temperature rise rate of 2.5° C./min, and under a load of 49 mN. The results are shown in Table 2.

(2) Production of Sheet 4P

The resin compositions A to H were used to form sheets 4P-X1, 4P-X2, 4P-X3, and 4P-X4 according to Examples and sheets 4P-R1 and 4P-R2 according to Comparative Examples by coating method, each sheet including a space maintaining layer (41P) and a stress release layer (42P) in combination as shown in Table 2. The space maintaining layer (41P) and the stress release layer (42P) were formed in a thickness of 100 μm and 200 μm, respectively.

TABLE 2

|  |  | 4P-X1 | 4P-X2 | 4P-X3 | 4P-X4 | 4P-R1 | 4P-R2 |
|---|---|---|---|---|---|---|---|
| Space maintaining layer | Resin composition | C | D | C | C | G | E |
| Uncured product | $\tan\delta1_t$ | 0.50 | 0.73 | 0.50 | 0.50 | 0.59 | 0.45 |
| Cured product | Tg (° C.) | 140 | 145 | 140 | 140 | 120 | 90 |
|  | Coeff of linear expansion (ppm/K) | 11 | 16 | 11 | 11 | 35 | 53 |
| Stress release layer | Resin composition | A | B | D | H | F | A |
| Uncured product | $\tan\delta2_t$ | 0.54 | 0.49 | 0.60 | 0.71 | 1.24 | 0.49 |
|  | $G2'$ | $8 \times 10^4$ | $3 \times 10^4$ | $3 \times 10^5$ | $8 \times 10^4$ | $6 \times 10^4$ | $3 \times 10^4$ |
| Cured product | Smallest $\tan\delta2$ | 0.15 | 0.08 | 0.02 | 0.01 | 0.01 | 0.15 |
|  | Tg (° C.) | 60 | 64 | 145 | 143 | 143 | 60 |
|  | Coeff of linear expansion (ppm/K) | 41 | 38 | 16 | 19 | 19 | 41 |
| Sealing temperature t (° C.) |  | 100 | 80 | 100 | 100 | 80 | 80 |
| Sealing performance |  | Excellent | Good | Excellent | Good | Fair | Excellent |
| Heat cycle test |  | Excellent | Excellent | Excellent | Good | Poor | Poor |

(3) Manufacturing of Mounting Structure

The same model of three SAW chips (second circuit members, each 1.1 mm×1.1 mm and 0.2 mm in height) were arranged in line and placed on a glass substrate (a first circuit member, 50 mm square and 0.2 mm thick), with gold bumps (each 100 μm in diameter and 20 μm in height) interposed therebetween, to obtain a mounting member. The separation distance between the SAW chips was 0.4 mm.

The obtained mounting member was sealed with the sheet 4P, to obtain a mounting structure. Specifically, after the sheet 4P was disposed on the mounting member such that the space maintaining layer 41P faced the SAW chips, the sheet 4P was pressed against the glass substrate in a reduced pressure atmosphere (400 Pa) and heated at a predetermined sealing temperature (t) for 1 min, and then heated at 150° C. for 180 min in an atmosphere of about 10,000 Pa (1 atm). The sealing temperature is shown in Table 2.

[Evaluation 2]

<Sealing Performance>

The obtained mounting structure was observed with a laser microscope from the glass substrate side, and evaluated according to the following criteria. The results are shown in Table 2.

A sufficiently large internal space is formed between all the SAW chips and the glass substrate, and the sealing material is filled between the SAW chips: Excellent A sufficiently large internal space is formed between all the SAW chips and the glass substrate, but in some of the internal spaces, the entry of a comparatively large amount of resin is observed: Good A sufficiently large internal space is formed between all the SAW chips and the glass substrate, and the sealing material is filled between the SAW chips; however, there are variations in the size of the internal space (the amount of resin having entered the hollow space) due to, for example, an entry of a particularly large amount of resin: Fair <Heat Cycle Test>

The mounting structure was subjected to repeated heat cycles, each cycle consisting of leaving it to stand in an environment of −55° C. and in an environment of +125° C. alternately for 15 min each. Every after 250 cycles, the mounting structure was checked for defects (cracks and peeling-off) with an optical microscope and a SAT (Scanning Acoustic Tomograph) from the glass substrate side, to determine the number of cycles performed until the defects occurred. The results according to the following criteria are shown in Table 2.

No defect was found until 800 cycles: Excellent

Defects occurred in less than 800 cycles and 500 cycles or more: Good

Defects occurred in less than 500 cycles: Poor

INDUSTRIAL APPLICABILITY

The manufacturing method of a mounting structure of the present invention uses a sheet capable of maintaining a space between the first circuit member and the second circuit member and suppressing expansion of the internal space, and is therefore useful as a method of manufacturing a mounting structure using a solder bump. Also, the sheet according to the present invention used in this method is suitably applicable for manufacturing a variety of mounting structures using a solder bump.

REFERENCE SIGNS LIST

10: mounting structure
1: first circuit member
2: second circuit member
3: solder bump
4P: sheet
   41P: space maintaining layer
   42P: stress release layer
4: sealing material (cured product of sheet)
   41: cured space-maintaining layer
   42: cured stress-release layer
20: mounting chip

The invention claimed is:

1. A manufacturing method of a mounting structure, the method comprising:
   a step of preparing a mounting member including a first circuit member and a plurality of second circuit members placed on the first circuit member via bumps, the mounting member having a space between the first circuit member and the second circuit member;
   a step of preparing a sheet having a space maintaining layer;
   a disposing step of disposing the sheet on the mounting member such that the space maintaining layer faces the second circuit members; and a sealing step of pressing the sheet against the first circuit member and heating the sheet, to seal the second circuit members so as to maintain the space, and to cure the sheet, wherein the bumps are solder bumps, the space maintaining layer after curing has a glass transition temperature of higher than 125° C., and a coefficient of thermal expansion at 125° C. or lower of 20 ppm/K or less, and the space maintaining layer has a loss tangent tan $\delta 1_t$ of 0.1 or more and 1 or less, at a temperature t when the second circuit members are sealed.

2. The manufacturing method of claim 1, wherein the sheet further includes a stress release layer, and the stress release layer after curing has a loss tangent tan $\delta 2$, in a temperature range equal to or lower than a glass transition temperature of the stress release layer after curing, being 0.02 or more at 40° C. or higher.

3. The manufacturing method of claim 2, wherein the stress release layer has a loss tangent tan $\delta 2_t$ of greater than 0.3 and a storage shear modulus of $1 \times 10^3$ Pa or more, at the temperature t when the second circuit members are sealed.

4. The manufacturing method of claim 1, wherein the first circuit member is a ceramic substrate.

5. A manufacturing method of an individualized mounting structure, the method comprising a step of dicing the mounting structure obtained by the manufacturing method of claim 1, to individualize the second circuit members.

6. A sheet for sealing a mounting member including a first circuit member and a plurality of second circuit members placed on the first circuit member via solder bumps, the mounting member having a space between the first circuit member and the second circuit member, the sheet comprising a space maintaining layer, wherein the space maintaining layer after curing has a glass transition temperature of higher than 125° C., and a coefficient of thermal expansion at 125° C. or lower of 20 ppm/K or less, and the space maintaining layer has a loss tangent tan $\delta 1_t$ of 0.1 or more and 1 or less, at a temperature t when the second circuit members are sealed.

7. The sheet of claim 6, further comprising a stress release layer, wherein the space maintaining layer is disposed at least on one outermost side, and the stress release layer after curing has a loss tangent tan $\delta 2$, in a temperature range equal to or lower than a glass transition temperature of the stress release layer after curing, being 0.02 or more at 40° C. or higher.

8. The sheet of claim 7, wherein the stress release layer has a loss tangent tan $\delta 2_t$ of greater than 0.3 and a storage shear modulus of $1 \times 10^3$ Pa or more, at the temperature t when the second circuit members are sealed.

* * * * *